United States Patent [19]

Hatano et al.

[11] 4,241,162

[45] Dec. 23, 1980

[54] LIGHT SENSITIVE PHOTORESIST MATERIALS

[75] Inventors: Yoshio Hatano; Takahiro Kohashi, both of Hachioji; Michiaki Hashimoto, Kokubunji; Saburo Nonogaki, Tokyo, all of Japan

[73] Assignee: Hitachi, Ltd., Japan

[21] Appl. No.: 747,040

[22] Filed: Dec. 2, 1976

Related U.S. Application Data

[63] Continuation-in-part of Ser. No. 592,357, Jul. 1, 1975, abandoned.

[30] Foreign Application Priority Data

Jul. 1, 1974 [JP] Japan .................................. 49-74344

[51] Int. Cl.² .......................... G03C 1/68; G03C 1/52; C12P 33/10
[52] U.S. Cl. ................................ 430/195; 204/159.14; 204/159.15; 521/60; 521/61; 536/56; 536/102; 430/287

[58] Field of Search .......................... 96/115 R, 91 N; 260/78 P, 89.75, 91.3 UP, 117; 430/287, 195; 204/159.14, 159.15; 521/60, 61, 351; 536/56, 102

[56] References Cited

U.S. PATENT DOCUMENTS

| | | | |
|---|---|---|---|
| 2,751,373 | 6/1956 | Unrah et al. | 260/78.5 |
| 2,787,546 | 4/1957 | Smith et al. | 96/115 |
| 2,882,161 | 4/1959 | Dann et al. | 96/114 |
| 3,033,782 | 5/1962 | Rauch et al. | 210/54 |
| 3,321,309 | 5/1967 | Retchel | 96/36 |
| 3,817,757 | 6/1974 | Yabe et al. | 96/115 R |
| 3,821,167 | 6/1974 | Asano et al. | 96/115 R |

Primary Examiner—Jack P. Brammer
Attorney, Agent, or Firm—Craig and Antonelli

[57] ABSTRACT

This invention relates to light sensitive photoresist materials which are used in the photo-engraving process or in the production of the phosphor screens of color picture tubes. The light sensitive photoresist materials of this invention are novel, water-soluble azide materials.

21 Claims, 2 Drawing Figures

LIGHT SENSITIVE PHOTORESIST MATERIALS

This application is a continuation-in-part of application Ser. No. 592,357 filed July 1, 1975, now abandoned.

BACKGROUND OF THE INVENTION

This invention relates to novel, light sensitive, photoresist materials which are used in the photo-engraving process or in the production of the phosphor screens of color picture tubes.

Light sensitive photoresist compositions which change their solvent solubility on exposure to light, are used for precision processing in the photo-engraving process or in the production of the phosphor screens of color picture tubes.

These light sensitive photoresist compositions are roughly divided in two types, namely the water-insoluble type and the water-soluble type, the choice between which depends on the intended use.

Water-insoluble light sensitive photoresist compositions require the use of organic solvents, and, in view of the cost and toxicity of these organic solvents, they recently tend to be replaced by water-soluble light sensitive photoresist compositions.

A typical example of a well-known water-soluble light sensitive photoresist composition is a mixture comprising a water-soluble polymer, such as gelatin and polyvinyl alcohol, and a dichromate such as ammonium dichromate. This mixture becomes water-insoluble on exposure to light. However, this light sensitive photoresist composition undergoes chemical changes at room temperature even with no exposure to light. It is therefore, defective in that its light sensitive characteristics are diminished when it is stored for a long time.

As a means of overcoming this defect, it has been proposed that an azide compound be used instead of the dichromate. A mixture of a water-soluble polymer and an azide compound is characterized in that it is quite stable in the dark and in that it can be stored for a long time without diminishment of the light sensitive characteristics.

Among the azide compounds that can be used as one component of the light sensitive photoresist composition, disodium 4,4'-diazidostilbene-2,2'-disulfonate is especially suitable for use in combination with a water-soluble polymer and is widely used in the way.

When a mixture of this azide compound and a water-soluble polymer is exposed to light rays of a suitable wavelength, the azide compound absorbs the light energy and decomposes. The decomposition product cross-links the polymer molecules to render the polymer water-insoluble. This insolubilization reaction does not occur at room temperature unless the mixture is exposed to light.

However, the azide compound only absorbs light rays at a wavelength of about 300 to 360 nm. Therefore, a photoresist composition comprising a mixture of this azide compound and a water-soluble polymer does not have too high of a sensitivity to light.

Furthermore, this azide compound is unreactive to polyvinyl alcohol (PVA) which has excellent physical properties, such as adhesion, when coated onto a suitable support material.

As for the known azide compounds that show a higher light sensitivity than the above-mentioned azide compound, there can be cited, for examples, the condensation products of p-azidobenzaldehyde with an aliphatic or an aromatic ketone such as acetone or cyclohexanone. However, these azide compounds are insoluble in water. Accordingly, it may be stated that no water-soluble light sensitive photoresist compositions can be obtained by mixing these condensed azide compounds with water-soluble polymers.

SUMMARY OF THE INVENTION

This invention relates to water-soluble light sensitive photoresist polymers which have at least one structural unit represented by the following general formula (1):

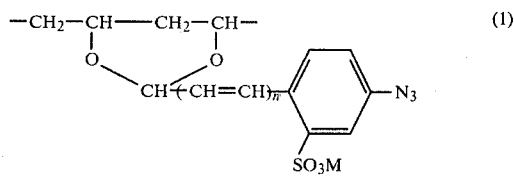

wherein n represents an integer from 1 to 6 and M represents an atom or an atomic group capable of being converted into a cation in an aqueous solution.

DESCRIPTION OF THE PREFERRED EMBODIMENTS

Figure 1:
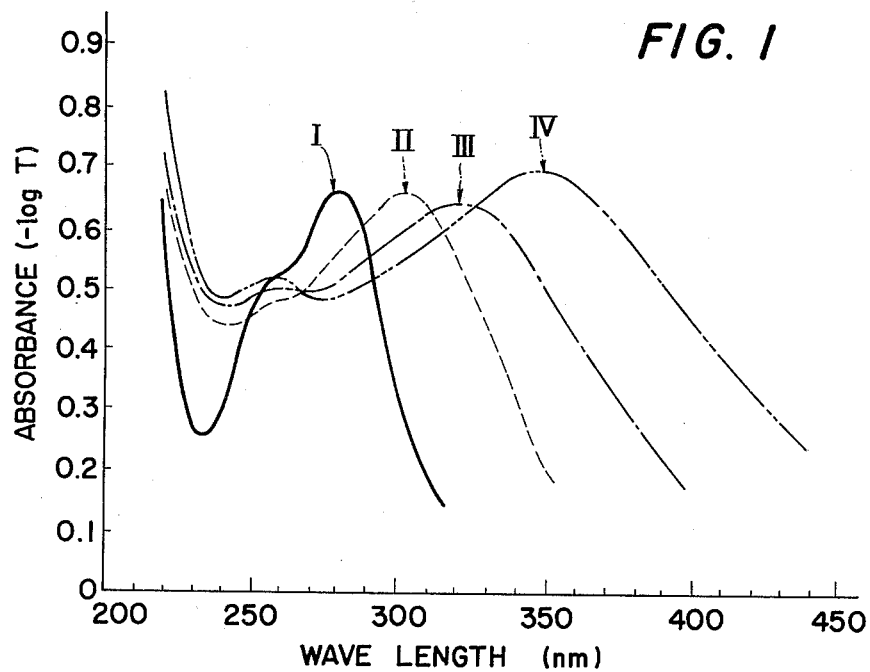
FIGS. 1 and 2 illustrate the relation between the absorbance and the wavelength of light in various azide compounds.

It is one object of the present invention to provide a new class of water-soluble, light sensitive organic polymers. A further object is to provide water-soluble, light sensitive photoresist compositions containing these new polymers.

These new polymers contain at least one structural unit represented by the previously mentioned general formula (1), wherein n represents an integer from 1 to 6 and M represents an atom or atomic group capable of being converted into a cation in an aqueous solution. As examples of the atom or the atomic group M, there can be cited those from H, alkali metals such as Na and K, ammonium ($NH_4$), alkaline earth metals such as $Mg_{\frac{1}{2}}$, $Ca_{\frac{1}{2}}$ and $Ba_{178}$ and metals of group III of the Periodic Table such as $Al_{\frac{1}{3}}$. The M+ (cation) is coupled to the $-SO^-_3$ (anion). For example, one calcium metal is coupled to two different $-SO^-_3$ groups. From a practical standpoint, the alkali metals and ammonium are advantageous. And, from the standpoint of the production of electronic circuits such as semiconductor devices, hydrogen and ammonium are suitable because they are metal-free.

These photoresist polymers can be synthesized by acetalization of alcholic hydroxyl group containing polymers and aldehyde- and azido group containing compounds in the presence of a catalyst such as sulfuric acid, hydrochloric acid or acetic acid.

The temperature for completion of this acetalization reaction is preferably between 0° C. and 100° C. and even more suitably between room temperature and 60° C.

The above-mentioned aldehyde- and azido group containing compounds can be represented by the following general formula (2):

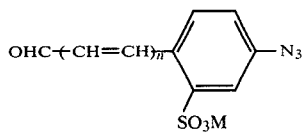
(2)

wherein n and M are as previously defined.

These compounds can be synthesized by condensation of 4-azidobenzaldehyde-2-sulfonic acid or one of its salts with an acetaldehyde or acetaldehydes as follows.

Sodium 4-azidobenzaldehyde-2-sulfonate to be used as the starting compound can be synthesized, for example, by oxidizing disodium 4,4'-diazidostilbene-2,2'-disulfonate with potassium permanganate or ozone gas.

This sodium 4-azidobenzaldehyde-2-sulfonate and prescribed quantities of acetaldehyde based on the integer n in general formula (2) were dissolved in water. An alkali catalyst such as calcium hydroxide, sodium hydroxide or potassium hydroxide was added to the solution. Then, the solution was heated in a water bath. In this way, the condensation product was synthesized.

As examples of the previously mentioned alcoholic hydroxyl group containing polymers, there can be mentioned cellulose, starch, gelatin, PVA, copolymers of vinyl alcohol and other monomers and their denatured derivatives, such as partially esterified or etherified cellulose, etc. The types of monomers forming copolymers with vinyl alcohol are ethylene and monomers which having ethylenic double bond, such as acrylamide, vinyl pyrrolidone, maleic acid derivatives and ethylene derivatives. Amounts of vinyl alcohol monomer are adequate from 0.2 to 99 mole percent, more preferably from 60 to 99 mole percent. The preferred molecular weight of these polymers is from 2,000 to 100,000.

When PVA is employed as the alcoholic hydroxyl group containing polymer, the photoresist polymer consists of the following recurring structural units (3) in random combination:

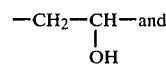
(3)

(a)

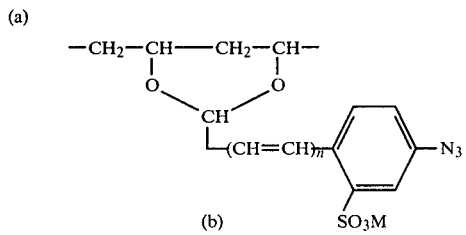
(b)

wherein n and M are as previously defined.

It is also within the possibilities of this invention to employ partially hydrolyzed polyvinyl esters. In this case, the photoresist polymers consist of the following recurring structural units (4) in random combination:

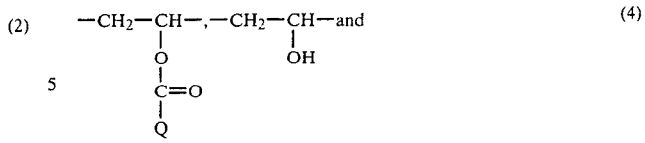
(4)

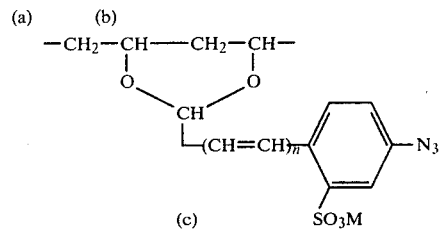
(c)

wherein n and M are as previously defined and wherein Q represents an alkyl group, e.g. methyl, ethyl, propyl, butyl, etc.

The preferred ratio of (4)-(c) units to the total number of units in each resin molecule can vary from 0.05 to 8 percent, more preferably from 0.5 to 3 percent. Namely, the preferred degree of acetalization of the total hydroxyl derivative groups (the sum of hydroxyl, esterified hydroxyl and acetalized hydroxyl groups) should range from 0.1 to 16 mole percent, more preferably from 1 to 6 mole percent. The amount of (4)-(a) units should preferably be less than 40 mole percent to the total hydroxyl derivative groups.

In general, the sensitivity of the photoresist polymer is increased as the molecular weight of the polymer or the amount of the azido group increases.

In photoresist polymers which are synthesized by acetalization, the group M may be replaced by another group. For example, the sodium (cation) of sodium sulfonate may be replaced by another cation, such as hydrogen, potassium, ammonium or the like. This substitution may be accomplished, for example, by double decomposition in an aqueous solution or by an ion exchange reaction using a cation exchange resin.

Furthermore, photoresist polymers which have a different integer n in the general formulas absorb different wavelengths of light. Accordingly, high sensitivity photoresist compositions which absorb a wide range of wavelengths are obtained by mixing polymers which have different integers n.

Photoresist compositions in which other water-soluble polymers such as PVA, copolymers of vinyl alcohol and other monomers, poly-N-vinyl pyrrolidone, polyacrylamide and gelatin are mixed together with the above-mentioned photoresist polymers can also be used. The amount of the water-soluble polymer should preferably be less than 50% by weight based on total composition and more preferably be less than 20% by weight. The lower amount of water-soluble polymer is 1% by weight.

Such a light sensitive photoresist composition is soluble in water. A film of this composition can be formed on the surface of a solid substrate by coating an aqueous solution of the composition on the surface of the solid substrate and then drying the coated surface. When the resulting film is exposed to light emitted from a light source such as a super high pressure mercury lamp or a tungsten lamp and is then washed with water, since the exposed areas of the film are insolubilized, the film at these insolubilized areas remain on the surface of the solid substrate. But the film at the unexposed areas is washed away because it still retains its water-solubility at the unexposed areas.

This technique can be applied to the photo-engraving process or to the production of the phosphor screens of color picture tubes. Furthermore, the light sensitive photoresist composition is characterized in that it has a high sensitivity and that an organic solvent need not be used. Therefore, the composition of this invention is very advantageous from the practical standpoint.

The film of photoresist compositions can, for example, be formed by spin coating. In spin coating, an aqueous solution containing from 0.1 to 10% by weight of the composition is adequate for coating at from 50 to 1000 r.p.m. rotation speed, and an aqueous solution containing from 10 to 20% by weight of the same is adequate for coating at from 4000 to 5000 r.p.m. rotation speed.

A film thickness of from 0.1 to 1.5 μm is adequate in the case of exposure from one side while an even thicker film is possible in the case of exposure from both sides. The resulting film has excellent adhesion to the surface of the solid substrate.

This invention will now be illustrated in detail by reference to the following example, which, by no means however, limits the scope of this invention.

EXAMPLE 1

10.0 g of sodium 4-azidobenzaldehyde-2-sulfonate, synthesized by oxidizing disodium 4,4'-diazidostilbene-2,2'-disulfonate with ozone, and 2.70 g of acetaldehyde were dissolved in 160 ml of water, and a reaction vessel charged with the resulting aqueous solution was immersed in a water bath maintained at 60° C. When the temperature of the reaction mixture reached 60° C., 2.10 ml of a solution of 10% by weight of sodium hydroxide in water was gradually added to the reaction mixture. The reaction mixture was maintained in this state for 4 hours. The reaction mixture was then cooled to room temperature, and about 40 g of sodium chloride was dissolved in the reaction mixture for the purpose of salting-out. The resulting yellowish red precipitate was separated from the mother liquor and dried. The sodium chloride was separated by extraction with ethanol. The resulting extraction solvent was evaporated under reduced pressure. 9.1 g of a yellowish orange precipitate was obtained. Recrystallization of this precipitate from water gave a yellowish orange precipitate.

Elementary analysis of the purified precipitate thus obtained showed 39.3% by weight of carbon, 2.2% by weight of hydrogen and 15.6% by weight of nitrogen. These results were quite in agreement with the calculated values for $C_9H_6N_3O_4NaS$, namely 39.3% by weight of carbon, 2.2% by weight of hydrogen and 15.3% by weight of nitrogen.

From the above results and from the results of the measurements of the infrared absorption spectrum and the proton nuclear magnetic resonance absorption, the purified product was identified as the aldehyde-azido group containing compound represented by general formula (2) wherein n is 1 and M is Na.

0.12 g of the above compound was dissolved in 5.0 g of an aqueous solution of 10% by weight of polyvinyl alcohol (degree of polymerization ($\overline{P}$): 2400, saponification value: 88%), and 10.0 ml of water was added in the solution. 0.20 ml of an aqueous solution of 10.0% by weight of sulfonic acid was then gradually added to the solution under agitation, and this solution was maintained under agitation for 2 minutes. The resulting solution was allowed to stand at room temperature for 15 hours. The solution was then neutralized with an aqueous solution of sodium carbonate, and gradually added to 20 ml of acetone under agitation. The precipitate formed was separated from the mother liquor. The resulting crude product was washed with ethanol and dried.

The crude product was dissolved in water, then treated with acetone to reprecipitate the purified product. This process was repeated several times. The yield was 0.35 g of a yellow precipitate.

Purification of the crude product may be accomplished by Electrodialysis, which employs a cation exchange membrane and an anion exchange membrane, or treatment with a cation exchange resin and an anion exchange resin in an aqueous solution of the crude product.

As a result of the measurement of the infrared absorption spectrum of the above precipitate, it was found that this purified product showed sharp absorption peak, at wave number 2120 $cm^{-1}$, and it was confirmed by this absorption peak that azido groups were present in the product.

The result of the measurement of the spectral absorption of an aqueous solution of the product using a quartz cell having a liquid length of 1 cm is shown by Curve 1 in FIG. 1.

From the results of the foregoing measurements and elementary analysis, it was confirmed that the product obtained was the suspected compound with the following, recurring structural units (5) in random combination:

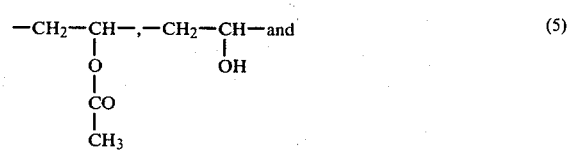

(a)   (b)

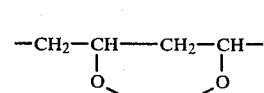

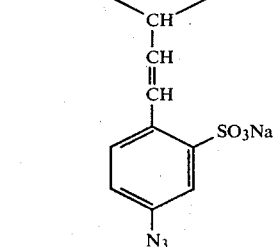

(c)

wherein the ratio of (5)-(c) units to the total number of units in each resin molecule, from the result of nitrogen analysis, is 1.4%.

EXAMPLE 2

10.0 g of sodium 4-azidobenzaldehyde-2-sulfonate, synthesized according to the method described in Example 1, and 4.4 g of acetaldehyde were dissolved in 200 ml of water, and a reaction vessel charged with the resulting aqueous solution was immersed in a water bath maintained at 60° C. When the temperature of the reaction mixture reached 60° C., 10 ml of a solution of 10% by weight of sodium hydroxide in water was gradually added to the reaction mixture. The reaction mixture was maintained in this state for 4 hours. The reaction mixture was then cooled to room temperature, and about 80 g of sodium chloride was dissolved in the reaction mixture for the purpose of saltingout. The resulting yellowish red precipitate was separated from the mother liquor and dried. The sodium chloride was separated by extraction with methanol. The resulting extraction solvent was evaporated under reduced pressure. 10.2 g of a yellowish red precipitate was obtained. Recrystallization of this precipitate from water gave a yellowish red precipitate.

From the results of the measurements of the infrared absorption spectrum and the proton nuclear magnetic resonance absorption, the purified product was identified as the aldehyde-azido group containing compound represented by general formula (2), wherein n is 2 and M is Na.

0.13 g of the above compound was dissolved in 5.0 g of an aqueous solution of 10% by weight of polyvinyl alcohol (degree of polymerization: 2400, saponification value: 88%), and 10.0 ml of water was added in the solution. 0.20 ml of an aqueous solution of 10.0% by weight of sulfonic acid was then gradually added to the solution under agitation, and this solution was maintained under agitation for 2 minutes. The resulting solution was allowed to stand at room temperature for 15 hours. The solution was then neutralized with an aqueous solution of sodium carbonate, and gradually added to 20 ml of acetone under agitation. The precipitate formed was separated from the mother liquor. The resulting crude product was washed with methanol and dried.

The crude product was purified according to the method described in Example 1. The yield was 0.40 g of a yellowish red precipitate.

As a result of the measurement of the infrared absorption spectrum of the above precipitate, it was found that this purified product showed sharp absorption peak at wave number 2120 cm⁻, and it was confirmed by this absorption peak that azido groups were present in the product.

The result of the measurement of the spectral absorption of an aqueous solution of this product using a quartz cell having a liquid length of 1 cm is shown by Curve II in FIG. 1.

From the results of the foregoing measurements and elementary analysis, it was confirmed that the product obtained was the suspected compound with the following recurring structural units (b) in random combination:

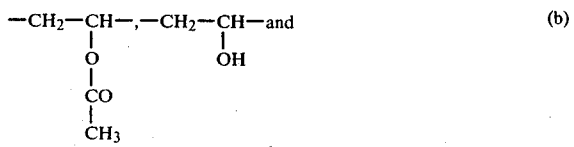

(a)   (b)

-continued

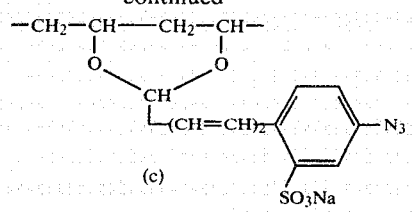

(c)

wherein ratio of (b)-(c) units to the total number of units in each resin molecule, from the result of nitrogen analysis, is 1.4%.

EXAMPLE 3

10.0 g of sodium 4-azidobenzaldehyde-2-sulfonate, synthesized according to the method described in Example 1, and 6.2 g of acetaldehyde were dissolved in 200 ml of water, and a reaction vessel charged with the resulting aqueous solution was immersed in a water bath maintained at 60° C. When the temperature of the reaction mixture reached 60° C., 15 ml of a solution of 15% by weight of sodium hydroxide in water was gradually added to the reaction mixture. The reaction mixture was maintained in this state for 3 hours. The reaction mixture was then cooled to room temperature, and about 80 g of sodium chloride was dissolved in the reaction mixture for the purpose of salting-out. The resulting yellowish red precipitate was separated from the mother liquor and dried. The sodium chloride was separated by extraction with methanol. The resulting extraction solvent was evaporated under reduced pressure. 11.8 g of a red precipitate was obtained. Recrystallization of this precipitate from water gave a red precipitate.

Elementary analysis of the purified precipitate thus obtained showed 47.3% by weight of carbon, 3.1% by weight of hydrogen and 12.5% by weight of nitrogen. These results were quite in agreement with the calculated values for $C_{13}H_{10}N_3O_4NaS$, namely 47.7% by weight of carbon, 3.1% by weight of hydrogen and 12.8% by weight of nitrogen.

From the above results and from the results of the measurements of the infrared absorption spectrum and the proton nuclear magnetic resonance absorption, the purified product was identified as the aldehyde-azido group containing compound represented by general formula (2), wherein n is 3 and M is Na.

0.14 g of the above compound was dissolved in 5.0 g of an aqueous solution of 10% by weight of polyvinyl alcohol (degree of polymerization: 2400, saponification value: 88%), and 10.0 ml of water was added in the solution. 0.20 ml of an aqueous solution of 10.0% by weight of sulfonic acid was then gradually added to the solution under agitation, and this solution was maintained under agitation for 2 minutes. The resulting solution was allowed to stand at room temperature for 15 hours. The solution was then neutralized with an aqueous solution of sodium carbonate, and gradually added to 20 ml of acetone under agitation. The precipitate thus formed was separated from the mother liquor. The resulting crude product was washed with methanol and dried.

The crude product was purified according to the method described in Example 1. The yield was 0.36 g of a red precipitate.

As a result of the measurement of its infrared absorption spectrum, it was found that this purified product showed sharp absorption peak at wave number 2120 cm$^{-1}$, and it was confirmed by this absorption peak that azido groups were present in the product.

The result of the measurement of the spectral absorption of an aqueous solution of the product using a quartz cell having a liquid length of 1 cm is shown by Curve III in FIG. 1.

From the results of the foregoing measurements and elementary analysis, it was confirmed that the product obtained was the suspected compound with the following recurring structural units (7) in random combination:

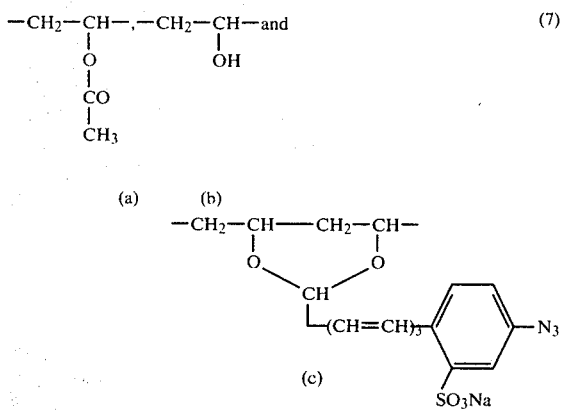

wherein the ratio of (7)-(c) units to the total number of units in each resin molecule, from the result of nitrogen analysis, is 1.4%.

EXAMPLE 4

10.0 g of sodium 4-azidobenzaldehyde-2-sulfonate, synthesized according to the method described in Example 1, and 7.1 g of acetaldehyde were dissolved in 300 ml of water, and a reaction vessel charged with the resulting aqueous solution was immersed in a water bath maintained at 60° C. When the temperature of the reaction mixture reached 60° C., 10 ml of a solution of 15% by weight of sodium hydroxide in water was gradually added to the reaction mixture. The reaction mixture was maintained in this state for 3 hours. The reaction mixture was then cooled to room temperature, and about 70 g of sodium chloride was dissolved in the reaction mixture for the purpose of salting-out. The resulting deep red precipitate was separated from the mother liquor and dried. The sodium chloride was separated by extraction with methanol. The resulting extraction solvent was evaporated under reduced pressure. A 63.8% yield of a deep red precipitate was obtained. Recrystallization of this precipitate from water gave a deep red precipitate.

Elementary analysis of the obtained purified precipitate showed 11.6% by weight of nitrogen. This result was in agreement with the calculated value for $C_{15}H_{12}N_3O_4NaS$, namely 11.9% by weight of nitrogen.

From the above result and from the result of the measurements of the infrared absorption spectrum and the proton nuclear magnetic resonance absorption, the purified product was identified as the aldehydeazido group containing compound represented by general formula (2), wherein n is 4 and M is Na.

0.15 g of the above compound was dissolved in 5.0 g of an aqueous solution of 10% by weight of polyvinyl alcohol (degree of polymerization: 2400, saponification value: 88%), and 10.0 ml of water was added in the solution. 0.20 ml of an aqueous solution of 10.0% by weight of sulfonic acid was then gradually added to the solution under agitation, and this solution was maintained under agitation for 2 minutes. The resulting solution was allowed to stand at room temperature for 23 hours. The solution was then neutralized with an aqueous solution of sodium carbonate, and gradually added to about 25 ml of acetone under agitation. The precipitate thus formed was separated from the mother liquor. The resulting crude product was washed with methanol and dried.

The crude product was purified according to the method described in Example 1. The yield was 0.35 g.

As a result of the measurement of the infrared absorption spectrum of the above precipitate, it was found that this purified product showed sharp absorption peak at wave number 2120 cm$^{-1}$, and it was confirmed by this absorption peak that azido groups were present in the product.

The result of the measurement of the spectral absorption of an aqueous solution of the product using a quartz cell having a liquid length of 1 cm is shown by Curve IV in FIG. 1.

From the results of the foregoing measurements and elementary analysis, it was confirmed that the product obtained was the suspected compound with the following recurring structural units (8) in random combination:

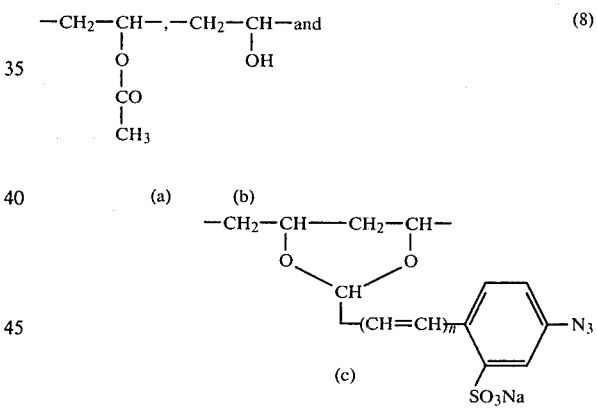

wherein n is 4 and wherein the ratio of (8)-(c) units to the total number of units in each resin molecule, from the result of nitrogen analysis, is 1.5%.

EXAMPLE 5

0.2 g of a product synthesized according to the method described in Example 4 was dissolved in 10 ml of water. 2 g of a cation exchange resin (sold by Rohm and Haas Co., under the trade name "Amberlite") was added in the solution, and the mixture was maintained under agitation for about 5 minutes. The color of the solution changed from deep red to dark violet.

After the cation exchange resin was separated with a filter, the solution was added to acetone under agitation. A dark violet precipitate formed and was separated from the mother liquor, and dried under reduced pressure. The yield was 0.08 g. The spectral absorption of an aqueous solution of this product was the same as that of Example 4 and is shown by Curve IV in FIG. 1. This product was identified as the photoresist material represented by general formula (4), wherein Q is methyl, n is 4 and M is H.

EXAMPLE 6

0.08 g of a product synthesized according to the method described in Example 5 was dissolved in 1 ml of water. When ammonia gas was introduced into the solution under agitation, the color of the solution changed from dark violet to red. This solution was added to acetone under agitation. A red precipitate formed and was separated from the mother liquor and dried under reduced pressure. The yield was 0.05 g. The spectral absorption of an aqueous solution of this product was the same as that shown by Curve IV in FIG. 1. This product was identified as the photoresist material represented by general formula (4) wherein Q is methyl, n is 4 and M is $NH_4$.

EXAMPLE 7

10.0 g of sodium 4-azidobenzaldehyde-2-sulfonate, synthesized according to the method described in Example 1, and 10.4 g of acetaldehyde were dissolved in 300 ml of water. The solution was treated according to the method described in Example 4, and the reaction products were obtained. These products were a mixture of aldehyde and azido group containing compounds represented by general formula (2) wherein M is Na and n is various integers.

Figure 2:
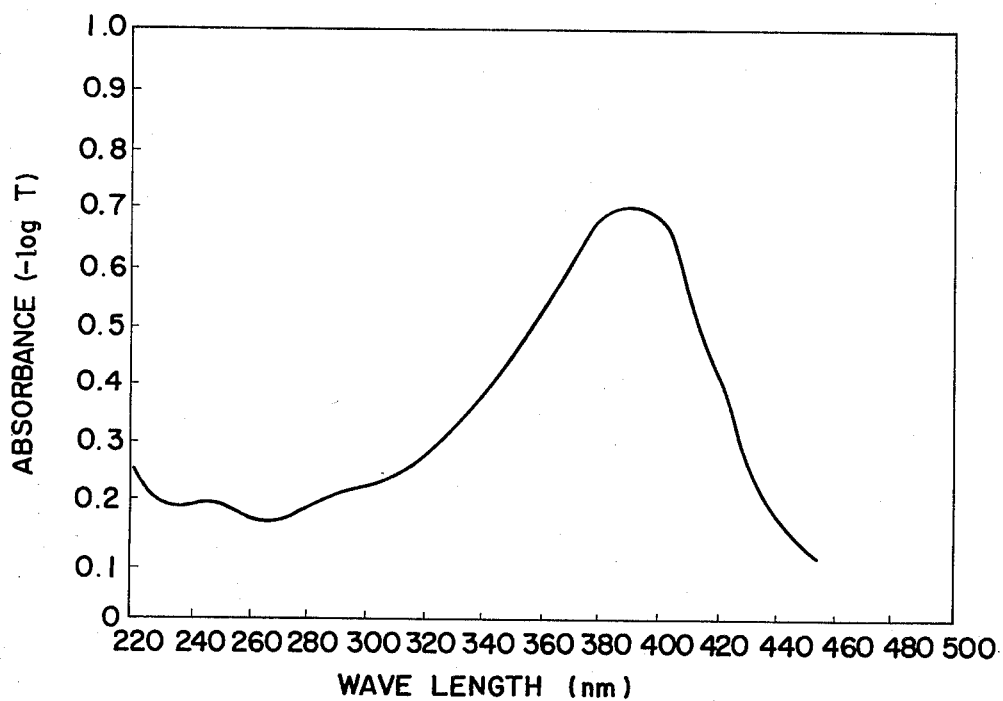

0.15 g of this mixture was dissolved in 5.0 g of an aqueous solution of 10% by weight of polyvinyl alcohol (degree of polymerization: 2400, saponification value: 88%). The solution was treated according to the method described in Example 4. The crude products thus obtained were isolated by a column chromatographic method employing "Sephadex G-15" (the trade name used by Pharmacia Co.). The purified product, whose spectral absorption showed a longer wavelength than any other product, consisted substantially of the substance represented by general formula (8) wherein n is 6. Because the maximum wavelength of the spectral absorption of this product is 390 nm as is shown in FIG. 2, the absorption maximum of compounds to which a $(CH=CH)$ group was added to every aldehyde and adizo group shifted 20 μm toward the longer wavelength side compared with the beginning compounds as is shown by Curves I, II, III and IV in FIG. 1. The wavelength of the absorption maximum of the compound represented by general formula (8) wherein n is 4, is 350 nm as is shown in FIG. 1. Accordingly, in the synthesized product represented by general formula (8), n is 6 as previously mentioned.

EXAMPLE 8

Aqueous solutions of 3% by weight of each of the photoresist polymers synthesized in Examples 1, 2, 3, 4, 6 and 7 were coated on the surface of a glass plate and dried. The thickness of these resulting films was 1.0 μm. Each film was exposed to light and washed with water. When exposed for a long enough time, the films were insolubilized. The minimum exposure time necessary for insolubilization was determined. A super high pressure mercury lamp of 500 W was used as the light source for exposure, and the sample was exposed at a point 150 cm from the lamp. The illumination intensity of light at this exposure point was 1300 luxes. The exposure time of the light was changed stepwise, the minimum exposure times of the films of each of the photoresist polymers synthesized in Examples 1, 2, 3, 4, 6 and 7 were 3,3,2,1.5, 2 and 3 seconds respectively. These results show that these polymers have a high sensitivity to light.

EXAMPLE 9

200 g of an aqueous solution of 3% by weight of a photoresist polymer synthesized according to the method described in Example 4 and 100 g of europium activated yttrium oxysulfide phosphor ($Y_2O_2S:Eu$) were mixed. This suspension was coated on the front glass panel of a Braun picture tube by spin coating and dried. The resulting film was exposed to light, through a prescribed shadow mask from a super high pressure mercury lamp. The exposure time was 1.5 minutes and the exposure intensity was 800 luxes. The exposed areas were insolubilized. The film was washed with water to dissolve the unexposed areas and heated in air at 430° C. to remove the organic materials. The exposure time of conventional PVA and ammonium dichromate photoresist composition, is about 12 minutes under the same conditions. Accordingly, the exposure time of the photoresist polymers of the present invention is ⅛ that of the conventional composition.

EXAMPLE 10

50 g of europium activated yttrium oxysulfide phosphor, 100 g of an aqueous solution of 3% by weight of a 50:50 mixture of the photoresist materials synthesized in Examples 3 and 4, 0.015 g of N-(β-aminoethyl)-γ-amino propyltrimethoxysilan (adhesive), 0.25 g of "TAMOL 731" (the trade name for an anion-surface-active agent manufactured by Rohm and Haas Co.) and 0.025 g of "PLURONIC L-92" (the trade name for the surface-active agent:

wherein $m+n+m'=20\sim80$, manufactured by ASAHI DENKA CO.) were mixed.

This suspension was treated according to the method described in Example 9. The exposure time of the resulting film was also 1.5 minutes under the same conditions.

COMPARATIVE TEST 1

An aqueous solution of 3% by weight of a conventional photoresist composition comprised of 95% by weight of gelatin and 5% by weight of disodium 4,4'-diazidostilbene-2,2'-disulfonate was coated on the surface of a glass plate and dried. The thickness of the resulting film was 1.0 μm. This film was then exposed to light and treated according to the method described in Example 8. The minimum exposure time required was found to be 12 seconds.

From a comparison of the minimum exposure time of 12 seconds for the photoresist composition prepared above with the minimum exposure times described in Example 8 of the present application, it is shown that the sensitivity of the photoresist composition of the present invention is about 4 to 8 times greater than that of the foregoing comparative photoresist composition.

COMPARATIVE TEST 2

11 g of p-azidobenzaldehyde, 21.4 g of p-hydroxy benzaldehyde and 20 ml of 30% sulfuric acid aqueous solution were added successively to each dispersion of PVA (GM-14: $\overline{P}=1400$ and NL-05: $\overline{P}=500$) in 300 ml of glacial acetic acid while stirring the mixture. The mixtures were then heated while stirring for 3 hours at 50°~60° C. for acetalization. These reaction mixtures were cooled and dropped into water to educe the resin, which were washed with water and dried.

Two conventional photoresist compositions containing 5 g of each photoresist polymer obtained by the above method, 0.5 g of 2-nitrofluorene as a sensitizer, and 100 g of ethyleneglycol monoethylether, were coated on the surface of glass plates and dried respectively. The thickness of these resulting films was 1.0 μm. Each film was exposed to light as described in Example 8 and washed with ethyleneglycol monoethylether.

The minimum exposure times of the films of each of the photoresist compositions synthesized from PVA (GM-14) and PVA (NL-05) were 25 and 130 seconds, respectively. These results show that the sensitivity of the photoresist composition of the present invention are about 8 to 87 times greater than that of the foregoing comparative photoresist composition.

The molecular weights of polymers mentioned above were obtained from the intrinsic viscosities.

What is claimed is:

1. A water-soluble light sensitive photoresist composition consisting essentially of at least one photoresist polymer which is soluble in water but rendered insoluble by exposure to light and having at least one structural unit represented by the following general formula:

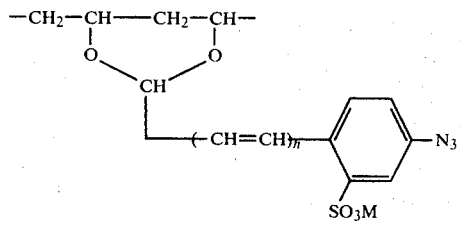

wherein n represents an integer from 1 to 6 and M represents an atom or an atomic group capable of being converted into a cation in an aqueous solution, and the ratio of the structural unit represented by said general formula to the total units in the photoresist polymer ranges between about 0.05 to 8%, the remaining structural units in said polymer being those of an alcoholic hydroxyl group-containing polymer.

2. The photoresist composition according to claim 1, wherein M is an atom or an atomic group selected from the group consisting of hydrogen, sodium, potassium, ammonium, magnesium, calcium, barium and aluminum.

3. The photoresist composition according to claim 1, wherein the molecular weight of the photoresist polymer ranges between about 2000 to 100,000.

4. A water-soluble light sensitive photoresist composition consisting essentially of at least one photoresist polymer which is soluble in water but rendered insoluble by exposure to light and having at least one structural unit represented by the following general formula:

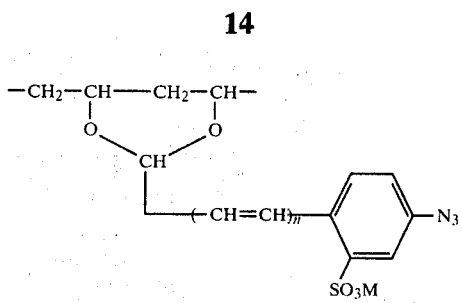

wherein n represents an integer from 1 to 6 and M represents an atom or an atomic group capable of being converted into a cation in an aqueous solution, and the ratio of the structural unit represented by said general formula to the total units in the photoresist polymer ranges between about 0.05 to 8%, the remaining structural units in said polymer being those of an alcoholic hydroxyl group containing polymer, and at least one water-soluble polymer, the amount of said water-soluble polymer being in the range of from 1% to 50% by weight based on the total composition.

5. The photoresist composition according to claim 4, wherein the water-soluble polymer is selected from the group consisting of polyvinyl alcohol, the copolymers of vinyl alcohol and other monomers, poly-N-vinylpyrrolidone, polyacrylamide and gelatin.

6. A water-soluble, light sensitive photoresist composition consisting essentially of at least one copolymer which is soluble in water but rendered insoluble by exposure to light and represented by the following recurring structural units in random combination:

$$-CH_2-CH- \text{ and}$$
$$\quad\quad\quad |$$
$$\quad\quad\quad OH$$

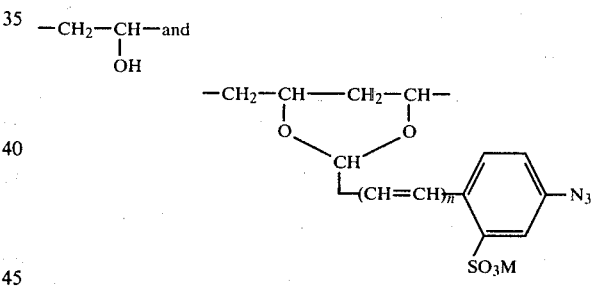

wherein N represents an integer from 1 to 6 and M represents an atom or an atomic group capable of being converted into a cation in an aqueous solution, and the ratio of the structural unit containing an azido group represented by said general formula to the total units in the copolymer ranges between about 0.05 to 8%.

7. The photoresist composition according to claim 6, wherein M is an atom or atomic group selected from the group consisting of hydrogen, sodium, potassium, ammonium, magnesium, calcium, barium and aluminum.

8. The photoresist composition according to claim 6, wherein the molecular weight of the copolymer is between about 2000 to 100,000.

9. A water-soluble light sensitive photoresist composition consisting essentially of at least one copolymer which is soluble in water but rendered insoluble by exposure to light and represented by the following recurring structural units in random combination:

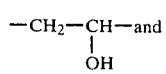

-continued

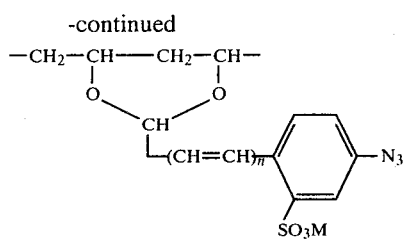

wherein n represents an integer from 1 to 6 and M represents an atom or an atomic group capable of being converted into a cation in an aqueous solution, and the ratio of the structural unit containing an azido group represented by said general formula to the total units in the copolymer ranges between about 0.05 to 8%, and at least one water-soluble polymer, the amount of said water-soluble polymer being in the range of from 1% to 50% by weight based on the total composition.

10. The photoresist composition according to claim 9, wherein the water-soluble polymer is selected from the group consisting of polyvinyl alcohol, the copolymers of vinyl alcohol and other monomers, poly-N-vinylpyrrolidone, polyacrylamide and gelatin.

11. A water-soluble, light sensitive photoresist composition consisting essentially of at least one copolymer which is soluble in water but rendered insoluble by exposure to light and represented by the following recurring structural units in random combination:

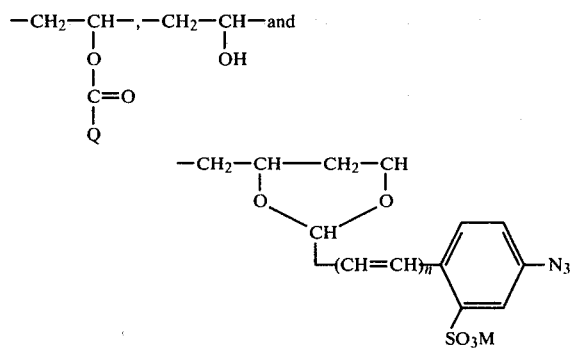

wherein n represents an integer from 1 to 6, M represents an atom or an atomic group capable of being converted into a cation in an aqueous solution and Q represents an alkyl group, and the ratio of the structural unit containing an azido group represented by the said general formula to the total units in the copolymer ranges between about 0.05 to 8%.

12. The photoresist composition according to claim 11, wherein M is an atom or atomic group selected from the group consisting of hydrogen, sodium, potassium, ammonium, magnesium, calcium, barium and aluminum.

13. The photoresist composition according to claim 11, wherein Q is an alkyl group selected from the group consisting of methyl, ethyl, propyl and butyl.

14. The photoresist composition according to claim 11, wherein the molecular weight of the copolymer is between about 2000 to 100,000.

15. A water-soluble light sensitive photoresist composition consisting essentially of at least one copolymer which is soluble in water but rendered insoluble by exposure to light and represented by the following recurring structural units in random combination:

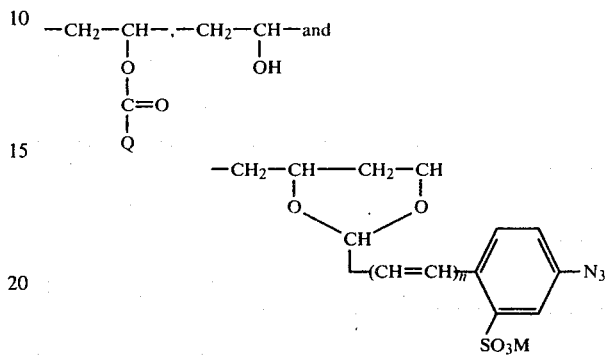

wherein n represents an integer from 1 to 6, M represents an atom or an atomic group capable of being converted into a cation in an aqueous solution and Q represents an alkyl group, and the ratio of the structural unit containing an azido group represented by the said general formula to the total units in the copolymer ranges between about 0.05 to 8% and at least one water-soluble polymer, the amount of said water-soluble polymer being in the range of from 1% to 50% by weight based on the total composition.

16. The photoresist composition according to claim 15, wherein the water-soluble polymer is selected from the group consisting of polyvinyl alcohol, the copolymers of vinyl alcohol and other monomers, poly-N-vinylpyrrolidone, polyacrylamide and gelatin.

17. The photoresist composition according to claim 1, wherein said composition contains photoresist polymers having different integers n to provide a photoresist composition which absorbs a wide range of wavelengths.

18. The photoresist composition according to claim 6, wherein said composition contains photoresist polymers having different integers n to provide a photoresist composition which absorbs a wide range of wavelengths.

19. The photoresist composition according to claim 10, wherein said composition contains photoresist polymers having different integers n to provide a photoresist composition which absorbs a wide range of wavelengths.

20. The photoresist composition according to claim 11, wherein said composition contains photoresist polymers having different integers n to provide a photoresist composition which absorbs a wide range of wavelengths.

21. The photoresist composition according to claim 1, wherein the ratio of the structural unit represented by the general formula to the total units in the photoresist polymer ranges between about 0.05 to 3%.

* * * * *